United States Patent
Chae et al.

(10) Patent No.: US 10,309,012 B2
(45) Date of Patent: Jun. 4, 2019

(54) WAFER CARRIER FOR REDUCING CONTAMINATION FROM CARBON PARTICLES AND OUTGASSING

(71) Applicant: SolarCity Corporation, San Mateo, CA (US)

(72) Inventors: Yongkee Chae, San Ramon, CA (US); Jiunn Benjamin Heng, San Jose, CA (US); Jianming Fu, Palo Alto, CA (US); Zheng Xu, Pleasanton, CA (US)

(73) Assignee: Tesla, Inc., Palo Alto, CA (US)

( * ) Notice: Subject to any disclaimer, the term of this patent is extended or adjusted under 35 U.S.C. 154(b) by 399 days.

(21) Appl. No.: 14/712,741

(22) Filed: May 14, 2015

(65) Prior Publication Data

US 2016/0002774 A1    Jan. 7, 2016

Related U.S. Application Data

(60) Provisional application No. 62/020,957, filed on Jul. 3, 2014.

(51) Int. Cl.
   *C23C 16/458*   (2006.01)
   *C23C 16/44*    (2006.01)
   *H01L 21/687*   (2006.01)

(52) U.S. Cl.
   CPC ...... *C23C 16/4404* (2013.01); *C23C 16/4581* (2013.01); *C23C 16/4585* (2013.01); *H01L 21/6875* (2013.01); *H01L 21/68735* (2013.01); *H01L 21/68757* (2013.01); *H01L 21/68771* (2013.01)

(58) Field of Classification Search
   CPC .................................. H01L 21/68771
   See application file for complete search history.

(56) References Cited

U.S. PATENT DOCUMENTS

| | | | |
|---|---|---|---|
| 819,360 A | 3/1902 | Mayer | |
| 2,626,907 A | 1/1953 | Melvin De Groote | |
| 2,938,938 A | 5/1960 | Dickson | |
| 3,094,439 A | 6/1963 | Mann | |
| 3,116,171 A | 12/1963 | Nielson | |
| 3,459,597 A | 8/1969 | Baron | |
| 3,676,179 A * | 7/1972 | Bokros | C04B 41/5001 264/29.5 |
| 3,961,997 A | 6/1976 | Chu | |
| 3,969,163 A | 7/1976 | Wakefield | |

(Continued)

FOREIGN PATENT DOCUMENTS

| | | |
|---|---|---|
| CN | 1253381 | 5/2000 |
| CN | 1416179 | 10/2001 |

(Continued)

OTHER PUBLICATIONS

Parthavi, "Doping by Diffusion and Implantation", <http://www.leb.eei.uni-erlangen.de/winterakademie/2010/report/course03/pdf/0306.pdf>.

(Continued)

*Primary Examiner* — Aiden Lee
(74) *Attorney, Agent, or Firm* — Shun Yao; Park, Vaughan, Fleming & Dowler LLP

(57) ABSTRACT

A wafer carrier for carrying solar cell wafers during a deposition process is described. The carrier is coated with pyrolytic carbon, silicon carbide, or a ceramic material, and is adapted to receive and support the wafers.

12 Claims, 15 Drawing Sheets

(56) References Cited

U.S. PATENT DOCUMENTS

| | | | |
|---|---|---|---|
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,228,315 A | 10/1980 | Napoli |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,729,970 A | 3/1988 | Nath |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,155,051 A | 10/1992 | Noguchi |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 5,942,048 A | 8/1999 | Fujisaki |
| 6,017,581 A * | 1/2000 | Hooker | B05B 13/0285 |
| | | | 118/500 |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,408,786 B1 * | 6/2002 | Kennedy | C23C 16/4404 |
| | | | 118/723 AN |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,761,771 B2 * | 7/2004 | Satoh | C23C 16/4583 |
| | | | 118/723 E |
| 6,803,513 B2 | 10/2004 | Beernink |
| 6,841,051 B2 | 1/2005 | Crowley |
| 6,917,755 B2 * | 7/2005 | Nguyen | C23C 16/4581 |
| | | | 118/50.1 |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,119,901 B2 | 2/2012 | Jang |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,569,096 B1 | 10/2013 | Babayan |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 9,761,744 B2 | 9/2017 | Wang |
| 2001/0008143 A1 | 7/2001 | Sasaoka |
| 2001/0023702 A1 | 9/2001 | Nakagawa |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0118865 A1 | 6/2003 | Marks |
| 2003/0121228 A1 | 7/2003 | Stoehr |
| 2003/0136440 A1 | 7/2003 | Machida |
| 2003/0168578 A1 | 9/2003 | Taguchi |
| 2003/0183270 A1 | 10/2003 | Falk |
| 2003/0201007 A1 | 10/2003 | Fraas |

(56) References Cited

U.S. PATENT DOCUMENTS

| | | |
|---|---|---|
| 2004/0035458 A1 | 2/2004 | Beernink |
| 2004/0065363 A1 | 4/2004 | Fetzer |
| 2004/0094196 A1 | 5/2004 | Shaheen |
| 2004/0103937 A1 | 6/2004 | Bilyalov |
| 2004/0112419 A1 | 6/2004 | Boulanger |
| 2004/0112426 A1 | 6/2004 | Hagino |
| 2004/0123897 A1 | 7/2004 | Ojima |
| 2004/0126213 A1* | 7/2004 | Pelzmann ......... H01L 21/67109 414/416.01 |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022746 A1* | 2/2005 | Lampe ................. C23C 16/4581 118/728 |
| 2005/0022861 A1 | 2/2005 | Rose |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami |
| 2005/0126622 A1 | 6/2005 | Mukai |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2005/0263178 A1 | 12/2005 | Montello |
| 2005/0268963 A1* | 12/2005 | Jordan ............... H01L 31/02242 136/256 |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0029186 A1 | 2/2007 | Krasnov |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186853 A1* | 8/2007 | Gurary ............... C23C 16/4586 118/720 |
| 2007/0186968 A1 | 8/2007 | Nakauchi |
| 2007/0186970 A1 | 8/2007 | Takahashi |
| 2007/0187652 A1 | 8/2007 | Konno |
| 2007/0202029 A1 | 8/2007 | Burns |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0011350 A1 | 1/2008 | Luch |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092942 A1 | 4/2008 | Kinsey |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0128017 A1 | 6/2008 | Ford |
| 2008/0149161 A1 | 6/2008 | Nishida |
| 2008/0149163 A1 | 6/2008 | Gangemi |
| 2008/0156370 A1 | 7/2008 | Abdallah |
| 2008/0173347 A1 | 7/2008 | Korevaar |
| 2008/0173350 A1 | 7/2008 | Choi |
| 2008/0178928 A1 | 7/2008 | Warfield |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0223439 A1 | 9/2008 | Deng |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0014055 A1 | 1/2009 | Beck |
| 2009/0056805 A1 | 3/2009 | Barnett |
| 2009/0065043 A1 | 3/2009 | Hadorn |
| 2009/0078318 A1 | 3/2009 | Meyers |
| 2009/0084439 A1 | 4/2009 | Lu |
| 2009/0101872 A1 | 4/2009 | Young |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu |
| 2009/0155028 A1 | 6/2009 | Boguslayskiy |
| 2009/0160259 A1 | 6/2009 | Ravindranath |
| 2009/0188561 A1 | 7/2009 | Aiken |
| 2009/0194233 A1* | 8/2009 | Tamura ............... C23C 16/4404 156/345.1 |
| 2009/0211627 A1 | 8/2009 | Meier |
| 2009/0221111 A1 | 9/2009 | Frolov |
| 2009/0229660 A1 | 9/2009 | Takizawa |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0272419 A1 | 11/2009 | Sakamoto |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0131108 A1 | 5/2010 | Meyer |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |

(56) References Cited

U.S. PATENT DOCUMENTS

| | | |
|---|---|---|
| 2010/0236612 A1 | 9/2010 | Khajehoddin |
| 2010/0240172 A1 | 9/2010 | Rana |
| 2010/0243021 A1 | 9/2010 | Lee |
| 2010/0243059 A1 | 9/2010 | Okaniwa |
| 2010/0269904 A1 | 10/2010 | Cousins |
| 2010/0279492 A1 | 11/2010 | Yang |
| 2010/0282293 A1 | 11/2010 | Meyer |
| 2010/0295091 A1 | 11/2010 | Strzegowski |
| 2010/0300506 A1 | 12/2010 | Heng |
| 2010/0300507 A1 | 12/2010 | Heng |
| 2010/0300525 A1 | 12/2010 | Lim |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0048491 A1 | 3/2011 | Taira |
| 2011/0056545 A1 | 3/2011 | Ji |
| 2011/0073175 A1 | 3/2011 | Hilali |
| 2011/0088762 A1 | 4/2011 | Singh |
| 2011/0089079 A1* | 4/2011 | Lo ............... H01L 21/67333 206/711 |
| 2011/0120518 A1 | 5/2011 | Rust |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0174374 A1 | 7/2011 | Harder |
| 2011/0177648 A1 | 7/2011 | Tanner |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0300661 A1 | 12/2011 | Pearce |
| 2011/0308573 A1 | 12/2011 | Jaus |
| 2012/0000502 A1 | 1/2012 | Wiedeman |
| 2012/0012153 A1 | 1/2012 | Azechi |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0180851 A1 | 7/2012 | Nagel |
| 2012/0192932 A1 | 8/2012 | Wu |
| 2012/0199184 A1 | 8/2012 | Nie |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0199608 A1 | 8/2013 | Emeraud |
| 2013/0206213 A1 | 8/2013 | He |
| 2013/0206219 A1 | 8/2013 | Kurtin |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0239891 A1* | 9/2013 | Sonoda ............... C23C 14/042 118/719 |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0060621 A1 | 3/2014 | Clark |
| 2014/0066265 A1 | 3/2014 | Oliver |
| 2014/0096823 A1 | 4/2014 | Fu |
| 2014/0102524 A1 | 4/2014 | Xie |
| 2014/0120699 A1 | 5/2014 | Hua |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1 | 8/2014 | Albadri |
| 2014/0261624 A1 | 9/2014 | Cruz-Campa |
| 2014/0261654 A1 | 9/2014 | Babayan |
| 2014/0261661 A1 | 9/2014 | Babayan |
| 2014/0262793 A1 | 9/2014 | Babayan |
| 2014/0273338 A1 | 9/2014 | Kumar |
| 2014/0284750 A1 | 9/2014 | Yu |
| 2014/0299187 A1 | 10/2014 | Chang |
| 2014/0318611 A1 | 10/2014 | Moslehi |
| 2014/0345674 A1 | 11/2014 | Yang |
| 2014/0349441 A1 | 11/2014 | Fu |
| 2014/0352777 A1 | 12/2014 | Hachtmann |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0129024 A1 | 5/2015 | Brainard |
| 2015/0144180 A1 | 5/2015 | Baccini |
| 2015/0171230 A1 | 6/2015 | Kapur |
| 2015/0207011 A1 | 7/2015 | Garnett |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0325731 A1 | 11/2015 | Namjoshi |
| 2015/0333199 A1 | 11/2015 | Kim |
| 2015/0340531 A1 | 11/2015 | Hayashi |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |

(56) References Cited

U.S. PATENT DOCUMENTS

| | | |
|---|---|---|
| 2015/0349701 A1 | 12/2015 | Morad |
| 2015/0349702 A1 | 12/2015 | Morad |
| 2015/0349703 A1 | 12/2015 | Morad |
| 2016/0163888 A1 | 6/2016 | Reddy |
| 2016/0190354 A1 | 6/2016 | Agrawal |
| 2016/0204289 A1 | 7/2016 | Tao |
| 2016/0233353 A1 | 8/2016 | Tamura |
| 2016/0268963 A1 | 9/2016 | Tsai |
| 2016/0322513 A1 | 11/2016 | Martin |
| 2016/0329443 A1 | 11/2016 | Wang |
| 2017/0084766 A1 | 3/2017 | Yang |
| 2017/0162722 A1 | 6/2017 | Fu |
| 2017/0222082 A1 | 8/2017 | Lin |
| 2017/0288081 A1 | 10/2017 | Babayan |
| 2017/0373204 A1 | 12/2017 | Corneille |
| 2018/0122964 A1 | 5/2018 | Adachi |

FOREIGN PATENT DOCUMENTS

| | | |
|---|---|---|
| CN | 101233620 | 7/2008 |
| CN | 101553933 | 10/2009 |
| CN | 100580957 C | 1/2010 |
| CN | 101305454 | 5/2010 |
| CN | 102088040 | 6/2011 |
| CN | 102263157 | 11/2011 |
| CN | 104205347 | 12/2014 |
| CN | 104409402 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | 102012010151 | 11/2013 |
| EP | 1770791 | 4/2007 |
| EP | 1806684 | 8/2007 |
| EP | 2071635 | 6/2009 |
| EP | 2113946 | 11/2009 |
| EP | 2362430 | 8/2011 |
| EP | 2385561 | 11/2011 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | 5789269 | 6/1982 |
| JP | S7089269 | 6/1982 |
| JP | H04245683 A | 9/1992 |
| JP | 06196766 | 7/1994 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006523025 | 10/2006 |
| JP | 2006324504 | 11/2006 |
| JP | 2007123792 | 5/2007 |
| JP | 2008135655 | 6/2008 |
| JP | 2009054748 | 3/2009 |
| JP | 2009177225 | 8/2009 |
| JP | 2011181966 | 9/2011 |
| JP | 2012119393 | 6/2012 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 1991017839 | 11/1991 |
| WO | 9120097 A1 | 12/1991 |
| WO | 2003083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |
| WO | 2013020590 A1 | 2/2013 |
| WO | 2010085949 | 3/2013 |
| WO | 2013046351 | 4/2013 |
| WO | 2014066265 | 5/2014 |
| WO | 2014074826 | 7/2014 |
| WO | 2014110520 | 7/2014 |
| WO | 2014117138 | 7/2014 |
| WO | 2015183827 | 12/2015 |
| WO | 2015195283 | 12/2015 |
| WO | 2016090332 | 6/2016 |

OTHER PUBLICATIONS

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Hornbachner et al., "Cambered Photovoltaic Module and Method for its Manufacture" Jun. 17, 2009.

Machine translation of JP 10004204 A, Shindou et al.

Jianhua Zhao et al. "24% Efficient perl silicon solar cell: Recent improvements in high efficiency silicon cell research".

"Nonequilibrium boron doping effects in low-temperature epitaxial silicon" Meyerson et al., Appl. Phys. Lett. 50 (2), p. 113 (1987).

"Doping Diffusion and Implantation" Parthavi, <http://www.leb.eei.uni-erlangen.de/winterakademie/2010/report/content/course03/pdf/0306.pdf>.

WP Leroy et al., "In Search for the Limits of Rotating Cylindrical Magnetron Sputtering", Magnetron, ION Processing and ARC Technologies European Conference, Jun. 18, 2010, pp. 1-32.

Beaucarne G et al: 'Epitaxial thin-film Si solar cells' Thin Solid Films, Elsevier-Sequoia S.A. Lausanne, CH LNKD—DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Cui, 'Chapter 7 Dopant diffusion', publically available as early as Nov. 4, 2010 at <https://web.archive.org/web/20101104143332/http://ece.uwaterloo.ca/~bcui/content/NE/%020343/Chapter/%207%20Dopant%20 diffusion%20_%20I.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.

(56) References Cited

OTHER PUBLICATIONS

Green, Martin A. et al., 'High-Efficiency Silicon Solar Cells,' IEEE Transactions on Electron Devices, vol. ED-31, No. 5, May 1984, pp. 679-683.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heterojunction solar cells by hydrogenated amorphous silicon suboxide films." Applied Physics Letters 92.3 (2008): 033504-033504.
Munzer, K.A. "High Throughput Industrial In-Line Boron BSF Diffusion" Jun. 2005. 20th European Photovoltaic Solar Energy Conference, pp. 777-780.
National Weather Service Weather Forecast Office ("Why Do We have Seasons?" http://www.crh.noaa.gov/lmk/?n=seasons Accessed Oct. 18, 2014).
O'Mara, W.C.; Herring, R.B.; Hunt L.P. (1990). Handbook of Semiconductor Silicon Technology. William Andrew Publishing/Noyes. pp. 275-293.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Stangl et al., Amorphous/Crystalline Silicon heterojunction solar cells—a simulation study; 17th European Photovoltaic Conference, Munich, Oct. 2001.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP02020739, ISSN: 1674-1056, DOI: 10.1088/1674-1056/20/7/078402.
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.
Yao Wen-Jie et al: 'Interdisciplinary Physics and Related Areas of Science and Technology; The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
Cui, et al., Advanced Materials, 2001, col. 13, pp. 1476-1480 (Year:2001).
Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.
Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Meyerson et al. "Nonequilibrium boron doping effects in low-temperature epitaxial silicon", Appl. Phys. Lett. 50 (2), p. 113 (1987).
Li, "Surface and Bulk Passsivation of Multicrystalline Silicon Solar Cells by Silicon Nitride (H) Layer: Modeling and Experiments", Ph.D. dissertation, N.J. Inst. of Tech., Jan 2009.

\* cited by examiner

WAFER CARRIER FOR REDUCING CONTAMINATION FROM CARBON PARTICLES AND OUTGASSING

RELATED APPLICATION

This application claims the benefit of U.S. Provisional Application No. 62/020,957, entitled "Method and System for Preventing Formation of Carbon Particles or Outgas sing from CVD Carrier by Pyrolytic Carbon Coating," by inventors Yongkee Chae, Jiunn Benjamin Heng, Jianming Fu, and Zheng Xu, filed 3 Jul. 2014.

BACKGROUND

Field

This disclosure is generally related to the design of wafer carriers used in the fabrication of semiconductor devices. More specifically, this disclosure is related to wafer carriers used for large-scale manufacturing of solar cells.

Related Art

Crystalline-silicon based solar cells have been shown to have superb energy conversion efficiency. While device design and fabrication techniques continue to mature, and with the price of crystalline silicon becoming progressively lower, solar panels are being offered at historical low prices. In addition, with newly available financing plans and government subsidies, customers, both residential and commercial, now have unprecedented incentives to install solar panels. As a result, the solar market is expected to experience double-digit growth for many years to come.

Most of the current solar cell manufacturing facilities, however, are insufficiently equipped for large-scale production. The emerging solar market demands factories that can produce hundreds of megawatts, if not gigawatts, of solar cells per year. The design, size, and throughput of present facilities are not intended for such high-volume manufacturing. Hence, various new designs in the manufacturing process are needed.

SUMMARY

One embodiment of the present invention provides a wafer carrier for carrying solar cell wafers during a deposition process. The carrier is coated with pyrolytic carbon, silicon carbide, or a ceramic material, and is adapted to receive and support the wafers.

In a variation on this embodiment, the carrier comprises graphite or carbon fiber composite.

In a variation on this embodiment, the carrier is coated with pyrolytic carbon layer with a thickness between 10 and 50 micrometers.

In a variation on this embodiment, the pocket is configured to retain a wafer supported by the carrier that is a 5-inch by 5-inch square, a 6-inch by 6-inch square, a 5-inch by 5-inch pseudo-square, or a 6-inch by 6-inch pseudo-square.

In a variation on this embodiment, the carrier includes one or more pockets for retaining the wafers. The bottom of a respective pocket is partially carved out. The uncarved portion of the bottom has a flat top surface to support a wafer.

In a variation on this embodiment, the bottom of a respective pocket comprises a number of flat-top ridges or pillars for supporting a wafer.

In a variation on this embodiment, edges around and within a respective pocket are rounded.

In a variation on this embodiment, a respective pocket includes a sloped ramp along the pocket's rim, thereby facilitating wafer loading.

In a variation on this embodiment, the carrier includes an interlocking mechanism on at least one edge, thereby facilitating interlocking with a second carrier to form a wafer carrier system.

BRIEF DESCRIPTION OF THE FIGURES

In the figures, like reference numerals refer to the same figure elements.

DETAILED DESCRIPTION

Figure 1:
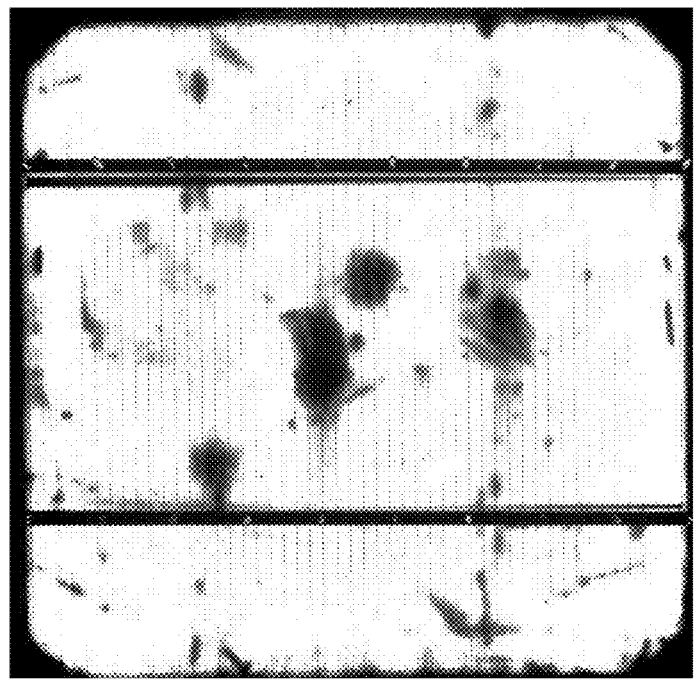
FIG. 1 shows a diagram illustrating the electroluminescence image of a Si-based solar cell that was fabricated by being placed directly on a conventional graphite carrier during PECVD.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention solve the problem of carrying a large number of wafers in a deposition chamber with reduced contamination from carbon particles and outgas sing by using a graphite or carbon fiber composite (CFC) wafer carrier coated with a low-porosity material, such as pyrolytic carbon or silicon carbide, which is resistant to abrasion and particle generation. Furthermore, to reduce the contact surface area between the wafer and the carrier, the bottom of the wafer-holding pockets in the carrier can have a non-flat surface or a partially carved-out structure.

The fabrication of solar cells often involves multiple chemical or physical vapor deposition (CVD or PVD) steps. During a large-scale CVD process, a number of Si wafers are placed in a wafer carrier and then loaded into the reaction chamber. A common material of wafer carrier is graphite, due to its high thermal conductivity and low mass density. However, graphite wafer carriers often generate carbon particles from physical contact and abrasion, which can contaminate the wafer surface. As described in more detail in later sections, coating the graphite or CFC wafer carrier with a low porosity material such as pyrolytic carbon or silicon carbide can substantially seal the pores on the carrier surface to reduce generation of carbon particles and outgas sing from the wafer-carrier material. Moreover, such coating prevents direct contact between the Si wafer and the graphite or CFC, which often causes carbon particles to escape from the carrier surface and attach to the wafer. To further reduce possible contamination, the bottom of the wafer-holding pockets can be a non-flat surface (such as one with a plurality of ridges) or a partially carved-out structure. This unique pocket design reduces direct contact between the wafer and the carrier while providing sufficient thermal and electrical conductivity.

CVD Wafer Carrier in Large-Scale Solar Cell Fabrication

A typical high-volume solar cell production line often includes one or more CVD tools, such as a plasma-enhanced CVD (PECVD) tool, which can batch-process Si wafers. During a typical PECVD process, multiple wafers are placed on a wafer carrier and loaded into the PECVD chamber for material deposition. The wafer carrier is exposed to a plasma-rich environment and subject to elevated temperatures. For example, a typical $SiO_2$ deposition process may require the wafer to reach a temperature between 150° C. and 300° C. In a conventional fabrication process, the wafers can be directly placed on and heated by a steel plate in the chamber. When wafer carriers are used for batch processing, the heat needs to be transferred to the wafers from the steel plate via the wafer carrier. Hence, a wafer carrier with sufficient thermal conductivity is desirable. Moreover, for high-volume production, the wafer carrier often has a large physical dimension to accommodate a large number of Si wafers. It is therefore desirable to use a low-density material to form the wafer carrier. Ideally, the wafer carrier should also have high purity and be resistance to process reagent.

Graphite based material, due to its high thermal conductivity and low mass density, is a desirable material for wafer carriers. There are, however, certain drawbacks in using graphite carriers in PECVD tools. For instance, when a graphite wafer carrier is in contact with other mechanical parts, such as when the carrier is fed into the chamber, fine carbon particles may escape from the surface of the carrier. These carbon particles can be deposited onto the front and back surfaces of the Si wafer.

FIG. 1 shows a diagram illustrating the electroluminescence image of a Si-based solar cell fabricated by a PECVD process using a conventional graphite wafer carrier. From FIG. 1, one can see that a number of black spots appear on the surface of the wafer. These black spots are caused by the surface contamination, such as carbon particles, during the PECVD process. Surface contamination can significantly impair product yield, because these black spots on the solar cell surface can lead to junction leakage, which in turn results in degraded performance of the solar cell. Note that the carbon particles can attach to the solar cell surface when the solar cell is in direct contact with the graphite carrier.

Figure 2:
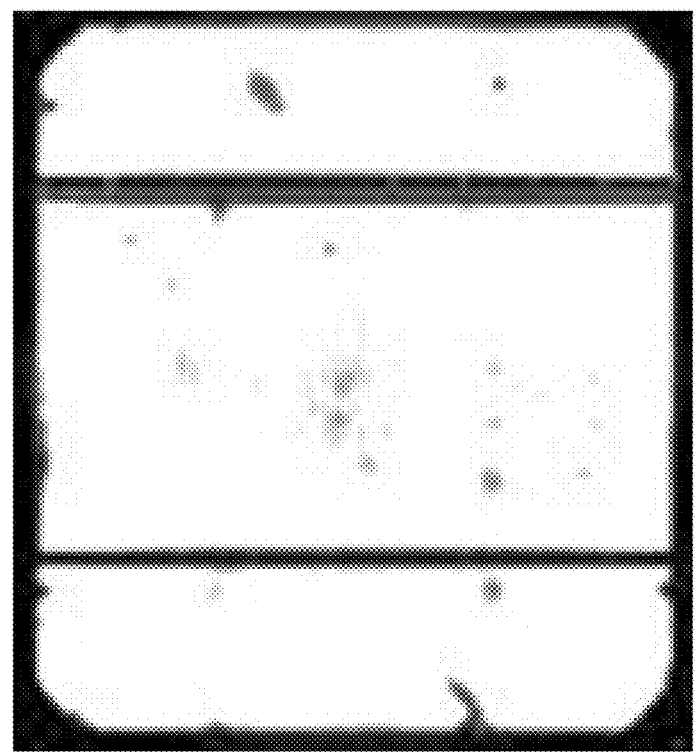
FIG. 2 shows a diagram illustrating the electroluminescence image of a Si-based solar cell fabricated by a PECVD process that involves non-direct contact between the wafer and a graphite carrier according to one embodiment of the present invention.

One way to reduce wafer surface contamination is to prevent direct contact between the wafer and the wafer carrier. FIG. 2 shows a diagram illustrating the electroluminescence image of a Si-based solar cell fabricated by a PECVD process that involves non-direct contact between the wafer and a graphite carrier according to one embodiment of the present invention. In this example, without direct contact with the graphite carrier, the surface of the fabricated solar cell is much cleaner compared with the solar cell surface shown in FIG. 1. To avoid direct contact, tone can insert a "dummy" Si wafer between the Si wafer under processing and the graphite carrier. However, inserting an additional Si wafer can be cumbersome, and under certain circumstances, this "dummy" wafer itself can be a source of contamination.

To reduce the graphite-carrier-induced contamination, in some embodiments, the surface of the graphite wafer carrier is coated with a layer of low-porosity material that is less prone to abrasion and particle generation. In general, the porosity of graphite is approximately 15% or greater, and the porosity of CFC can range from 0.03% to 5% or higher. Ideally, the porosity of the coating material is lower than the porosity of the underlying material of the wafer carrier. For example, the porosity of the coating materials can be less than 10%, preferably 1-5%, and more preferably 0-0.1%. Such coating materials include, but are not limited to, pyrolytic carbon, silicon carbide, and ceramic materials. Pyrolytic carbon can be formed by crystallizing graphite under high temperature or by using a CVD process. In some embodiments, the thickness of the coating layer can be between 1 and 100 micrometers, preferably between 10 and 50 micrometers. Pyrolytic carbon coating might be more desirable due to its thermal coefficient being close to that of graphite or CFC. Such coating can effectively prevent direct contact between the Si wafer under process and the graphite material of the carrier, resulting in reduced carbon particle contamination and hence better product yield.

Figure 3:
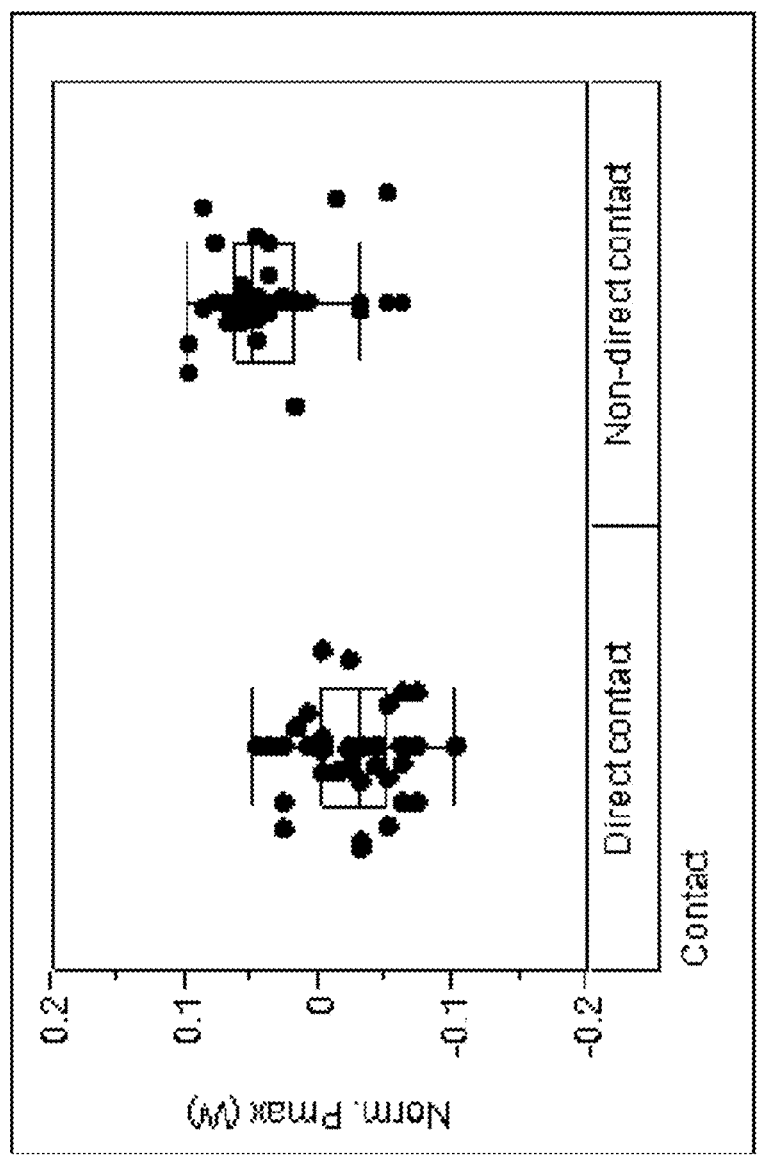
FIG. 3 shows a diagram illustrating the normalized maximum power output of solar cells that are fabricated under two different conditions according to one embodiment of the present invention.

FIG. 3 shows a diagram illustrating the normalized maximum power output of solar cells that are fabricated under two different conditions. The left portion of FIG. 3 shows the measured normalized maximum output power ($P_{max}$) of a number of solar cells fabricated with direct contact between the solar cells and the graphite carrier during the PECVD process. The right portion of FIG. 3 shows the measured normalized $P_{max}$ of a number of solar cells fabricated without direct contact between the solar cells and the graphite carrier. As shown in FIG. 3, the normalized $P_{max}$ is approximately 0.07 W higher for solar cells fabricated without direct contact between the solar cells and the graphite carrier.

Similar to graphite, carbon fiber composite (CFC) material, which has high strength and low density (between 1.5 and 1.8 g/cm$^3$), can also be used for wafer carriers. However, when used in a PECVD tool, CFC carriers face the problem of outgas sing. Due to the CFC's inherent fiber structure, a CFC wafer carrier may include an undesirable number of pores, which are harmful to the deposited films. The existence of these pores can result in environmental contaminants, such as $NO_x$, $SO_x$, etc., being absorbed into the CFC carrier, which can then lead to outgas sing during the PECVD process. In general, outgas sing is an undesirable effect during material deposition, because it not only contaminants the chamber and thus the wafers, but also causes bubbles in the deposited film. These bubbles can weaken the bonding between the current film and any subsequently deposited films. Coating the CFC carrier with pyrolytic carbon, silicon carbide, or other ceramic materials can effectively seal many pores that may exist on the surface of the CFC carrier, thus reducing outgas sing during the PECVD process.

Figure 4:
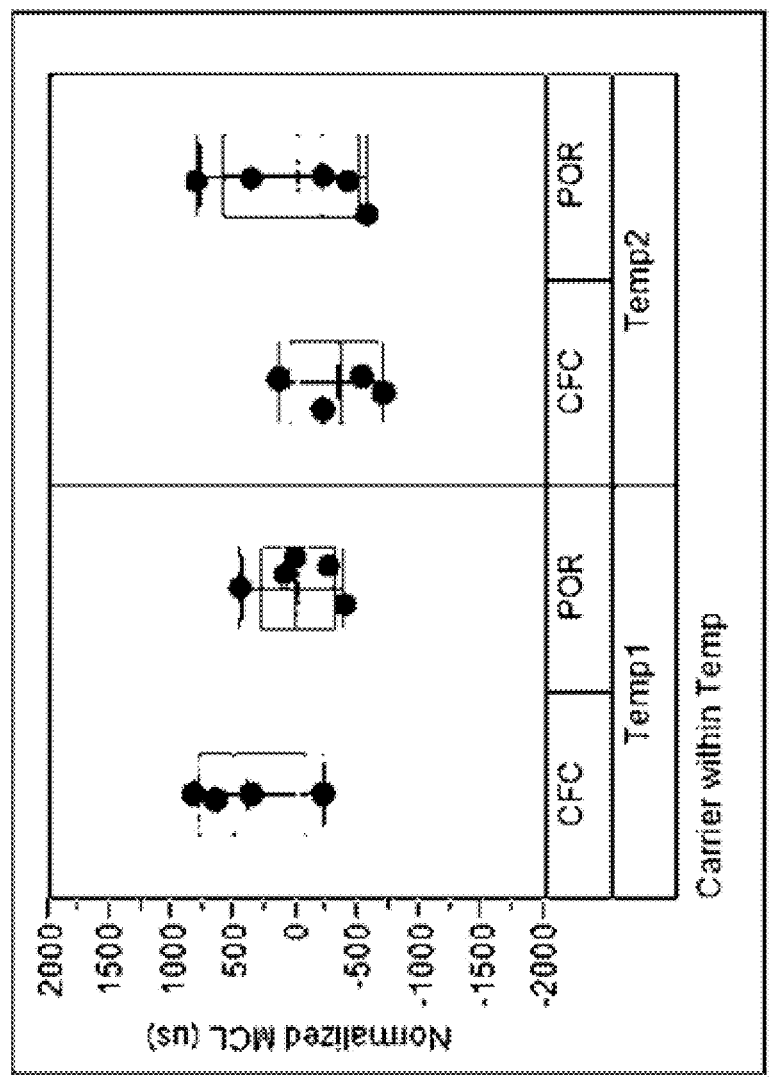
FIG. 4 shows a diagram illustrating the measured minority carrier lifetimes (MCLs) for solar cells that are fabricated using different carriers, according to one embodiment of the present invention.

When coated with pyrolytic carbon or SiC, CFC wafer carriers and graphite carriers can provide similar performance in terms of quality of the fabricated solar cells. FIG. 4 shows a diagram illustrating the measured minority carrier lifetimes (MCLs) for solar cells that are fabricated using different carriers, according to one embodiment of the present invention. In this example, under two different temperature settings, the normalized MCLs for solar cells that are fabricated using coated CFC carrier and pyrolytic-carbon-coated graphite carrier (POR) are similar.

In addition to porosity, other important properties of the coating material include its stiffness and hardness. Compared with other coating materials, pyrolytic carbon has a relatively low Young's modulus, which is approximately 39 Giga-Pascal (GPa). Meanwhile, the Young's modulus of crystalline Si (c-Si) is between 130 and 185 GPa. The relatively low Young's modulus of the pyrolytic carbon coating ensures that wafer carriers with such a coating will not cause damage to the Si wafers during the loading and unloading process. Note that the Young's modulus of SiC is approximately 450 GPa, which is much higher than that of c-Si. Therefore, pyrolytic carbon coating is in general preferred over SiC coating.

Figure 5:
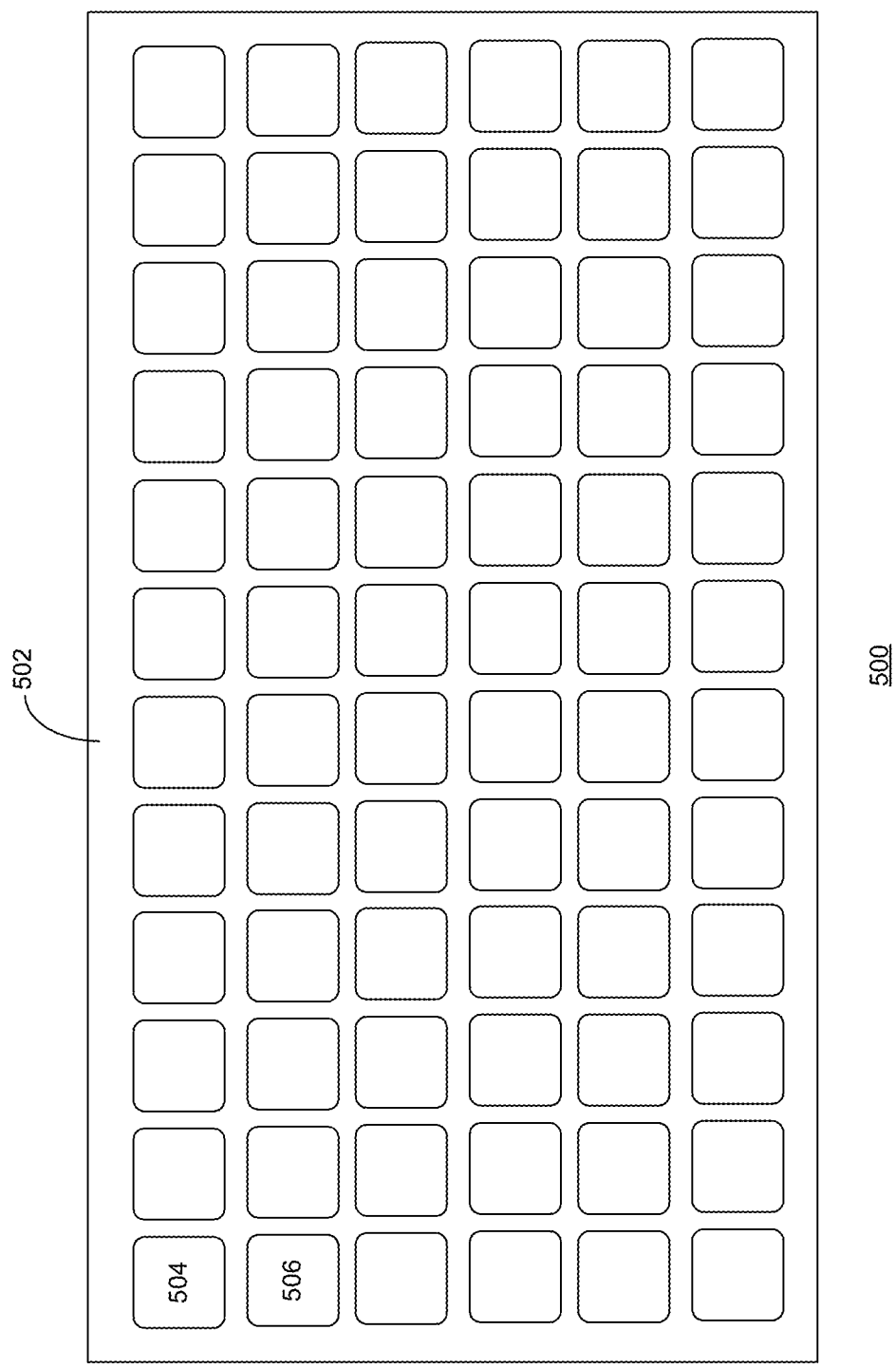
FIG. 5 shows a diagram illustrating an exemplary wafer carrier, according to an embodiment of the present invention.

FIG. 5 shows a diagram illustrating an exemplary wafer carrier, according to an embodiment of the present invention. In FIG. 5, wafer carrier 500 includes rectangular plate 502 and a number of pockets, such as pockets 504 and 506, located on plate 502. The size of plate 502 can vary depending on the size of the deposition tool. In some embodiments, plate 502 can include 12 pockets arranged in a 3-by-4 array, thus being capable of accommodating 12 wafers. For a CVD tool with a larger chamber, plate 502 can be larger to accommodate more wafers. Large-scale batch processing is preferred in solar cell fabrications due to the reduced cost. In some embodiments, plate 502 can include up to 72 or more pockets, which may be arranged in a 6-by-12 array, as shown in FIG. 5. Although FIG. 5 shows a rectangular wafer carrier, in practice, the wafer carrier may take any shape, such as circular, oval, square, etc.

In some embodiments, plate 502 is made of graphite, and the entire surface of plate 502 is coated with a layer of pyrolytic carbon or SiC. In further embodiments, the thickness of the pyrolytic carbon or SiC coating is between 1 and 100 micrometers, preferably between 10 and 50 micrometers. The pyrolytic carbon coating on the graphite plate not only suppresses formation of carbon particles but also prevents direct contact between the Si wafers under processing and the graphite surface. As shown in FIG. 3, elimination of the Si-graphite direct contact can improve the maximum power output of the fabricated solar cells.

In some embodiments, plate 502 is made of CFC. The surface of the CFC plate is coated with pyrolytic carbon or SiC, which can effectively seal at least a portion of the pores on the surface of the CFC plate, thus reducing outgas sing from the wafer carrier.

Figure 6:
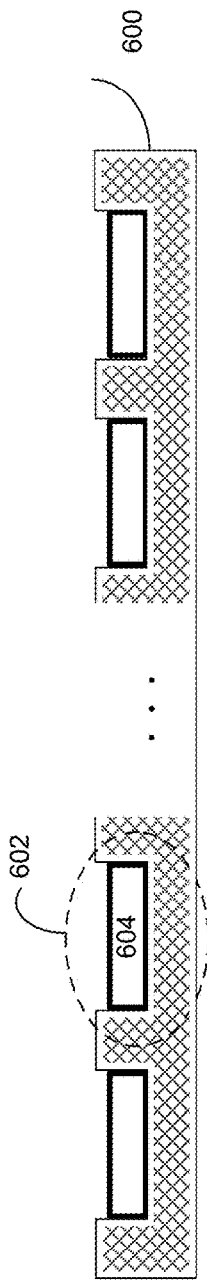
FIG. 6 shows a diagram illustrating a cross-sectional view of an exemplary wafer carrier, according to an embodiment of the present invention.

FIG. 6 shows a diagram illustrating a cross-sectional view of an exemplary wafer carrier, according to an embodiment of the present invention. Wafer carrier plate 600 includes a number of wafer pockets, such as pocket 602. The wafer pockets are indented regions that can confine a wafer, such as c-Si substrate 604 located within pocket 602. The depth of the pockets can be between 0.1 and 1 millimeter, making them suitable for containing substrates of various thicknesses, which can range from tens to hundreds of micrometers. The size and shape of the pockets can also vary based on application, i.e., the size and shape of wafers that are under process. In some embodiments, the pockets are designed to accommodate wafers of various sizes and shapes, including but not limited to: 5-inch by 5-inch pseudo-square (square with rounded corners), 6-inch by 6-inch pseudo-square, 5-inch by 5-inch square, and 6-inch by 6-inch square. Note that to accommodate wafers of a certain shape and size, the pockets can have a similar shape and a slightly larger size. Part of the bottom surface of the pockets to be in contact with the wafer can be configured to accommodate a fat wafer, or can have a contour shape to accommodate possible wafer warping.

Although the wafer carrier is coated with a low-porosity material, any contact between the wafer and wafer carrier may still result in possible contamination. Therefore, it is preferable to limit the area of contact between the wafers and the wafer carrier. In some embodiments, the bottom of the wafer pockets can be a non-flat surface or a partially carved-out structure. For example, the bottom surface of a wafer pocket can include a number of parallel ridges. The bottom of a wafer pocket can also be configured to have a mesh or honeycomb structure, such that the wafer contact area is reduced. On the other hand, it is desirable to retain sufficient wafer contact area to ensure good electrical and thermal conductivity between the wafer and the carrier. In some embodiments, the total wafer contact area can be between 10 and 50% of the size of the wafers.

Figure 7:
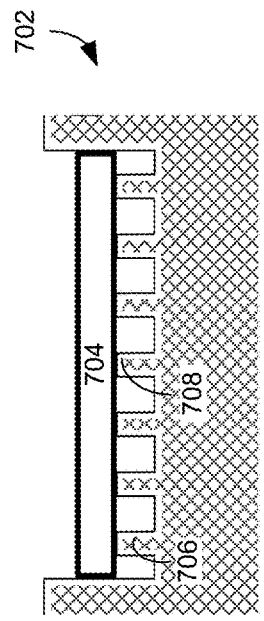
FIG. 7 shows a diagram illustrating a wafer pocket with a ridged bottom according to an embodiment of the present invention.

FIG. 7 shows a diagram illustrating a wafer pocket with a ridged bottom according to an embodiment of the present invention. In this example, the bottom surface of pocket 702 includes a number of ridges, such as ridges 706 and 708. The wafer contact area is now limited to the total top surface area of the ridges. For example, in FIG. 7, instead of being in contact with the entire bottom surface of pocket 702, wafer 704 is only in contact with the top surface of the ridges, such as ridges 706 and 708. In some embodiments, the total top surface area of the ridges is between 10 and 50% of the size of the wafer.

Figure 8:
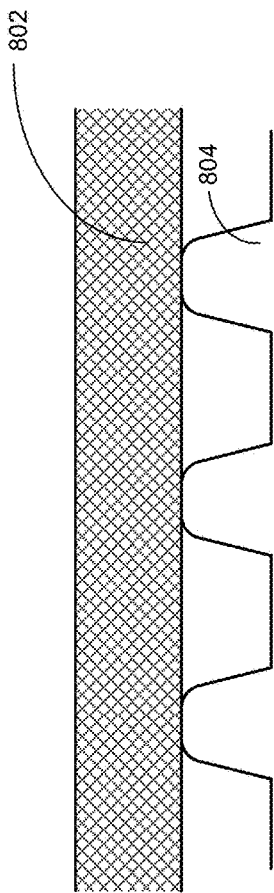
FIG. 8 shows an exemplary cross section of a ridged-bottom wafer pocket, according to one embodiment of the present invention.

In FIG. 7, the ridges have a cross section that is square or rectangular. In general, the cross section of the ridges may have different shapes, such as a partial sphere or a trapezoid. FIG. 8 shows an exemplary cross section of a ridged-bottom wafer pocket, according to one embodiment of the present invention. In this example, wafer 802 is supported by a number of ridges. Each ridge, such as ridge 804, has a cross section that is substantially a trapezoid, which helps increase the rigidity of the wafer carrier. Furthermore, the sloped sides of each ridge (compared with vertical side wall of square or rectangular shaped ridges) may facilitate more effective coating of the wafer carrier with pyrolytic carbon or SiC. For example, if the coating is done by deposition, a sloped surface could be more susceptible to deposited material than a vertical side wall.

In some embodiments, the corners on the wafer carrier that can potentially be in direct contact with the wafer or any mechanical part can be rounded to reduce the probability of particles being released from such contact. As shown in FIG. 8, the top surface of ridge 804 can have rounded edges. In one embodiment, the radius of a rounded edge is at least 0.1 mm, preferably greater than 0.5 mm, and more preferably greater than 1 mm.

Figure 9:
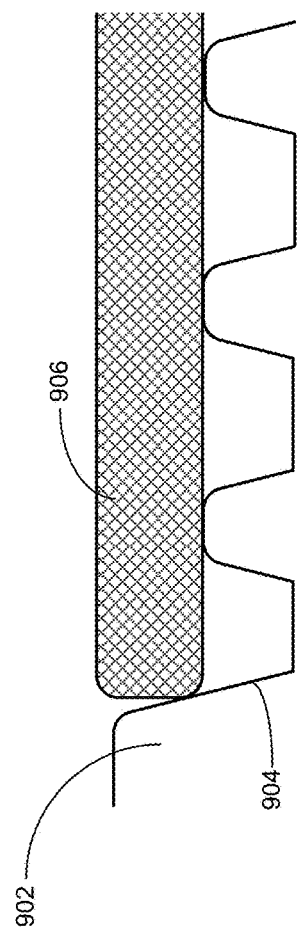
FIG. 9 shows a diagram illustrating such a configuration, according to an embodiment of the present invention.

In further embodiments, the rim of a wafer pocket can have a sloped ramp to "guide" the wafer when the wafer is loaded into the pocket. FIG. 9 shows a diagram illustrating such a configuration, according to an embodiment of the present invention. In this example, wafer pocket 902 includes a sloped ramp 904 along its rim. Sloped ramp 904 guides wafer 906 to a desired position where it can be in contact with the top surface of the ridges. In addition, the edge where sloped ramp 904 joins the top surface of wafer pocket 902 is rounded to reduce possible particle release due to contact with sharp edges.

Figure 10:
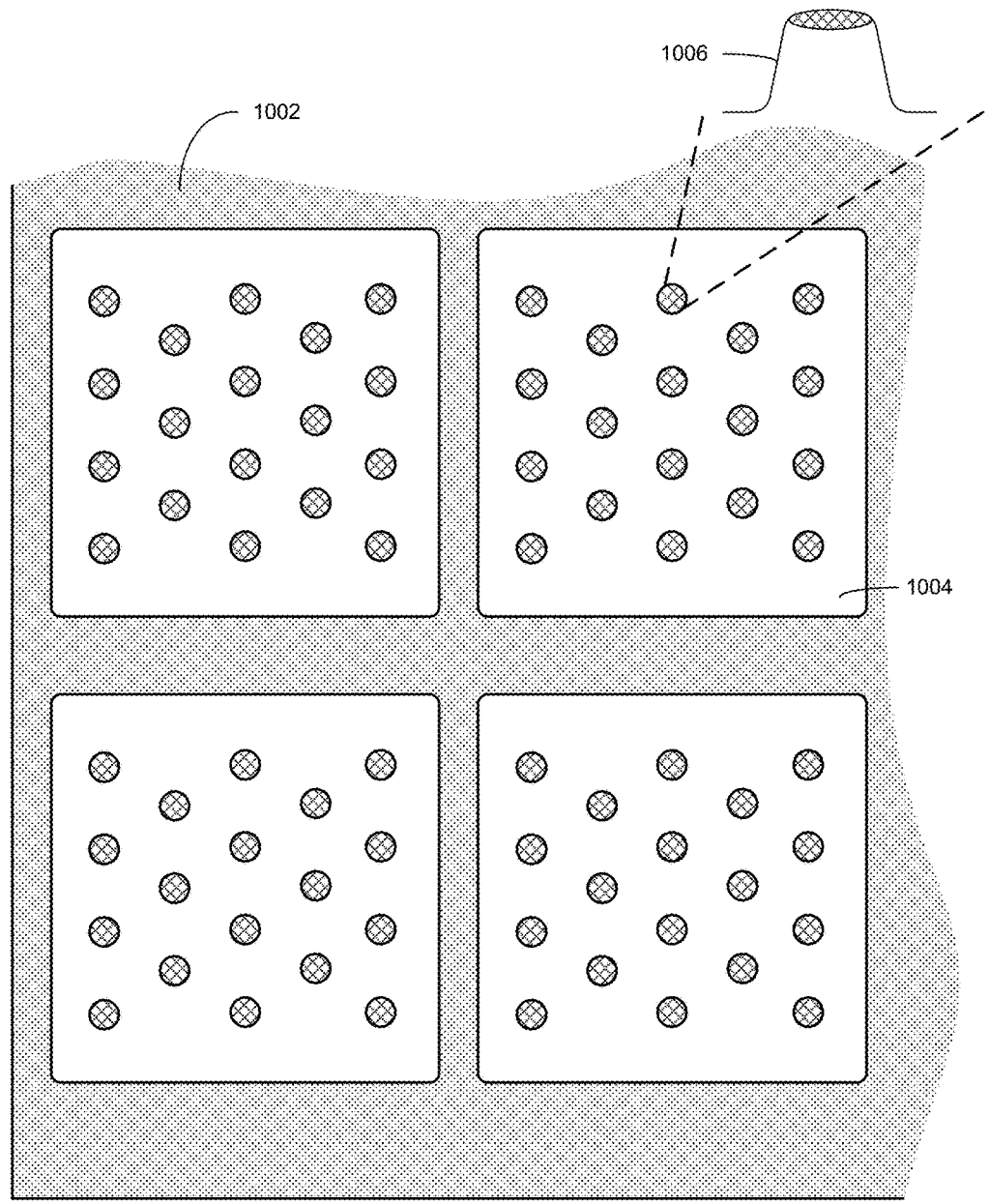
FIG. 10 shows a top view of an exemplary wafer carrier with wafer-supporting pillars, according to one embodiment of the present invention.

In addition to ridges, there are a variety of ways to pattern the bottom of a wafer pocket to reduce the contact area with a wafer. Such patterns of contact areas include, but are not limited to: circle, grid, mesh, hexagon, etc. FIG. 10 shows a top view of an exemplary wafer carrier with wafer-supporting pillars, according to one embodiment of the present invention. In this example, wafer carrier 1002 includes a number of wafer pockets, such as wafer pocket 1004. On the bottom of wafer pocket 1004 there are a number of support pillars, such as support pillar 1006. Each pillar has a flat top surface. Ideally, all the top surfaces of the pillars are in the same plane to ensure good contact with the wafer for thermal and electrical conductivity.

Figure 11:
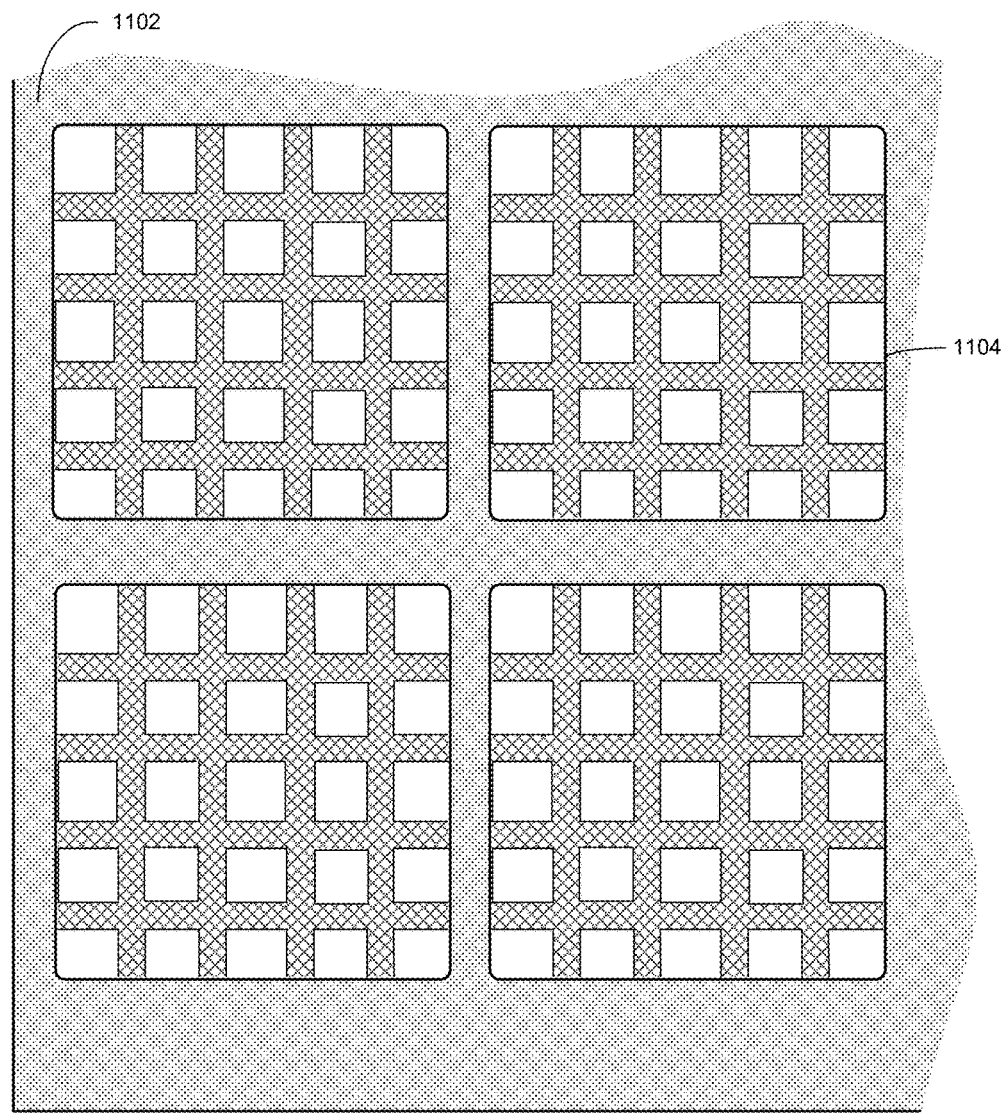
FIG. 11 shows a top view of an exemplary wafer carrier with a grid-like wafer-support structure on the bottom, according to one embodiment of the present invention.

FIG. 11 shows a top view of an exemplary wafer carrier with a grid-like wafer-support structure on the bottom, according to one embodiment of the present invention. In this example, wafer carrier 1102 includes a number of wafer pockets, such as wafer pocket 1104. The bottom of wafer pocket 1104 includes a grid structure, which protrudes from the bottom surface to support the wafer. The top surface of the support structure, which is illustrated in FIG. 11 with a cross hatch pattern, presents a grid pattern. This grid structure can improve the rigidity of wafer carrier 1102 because of the increased number of vertical walls within the wafer pockets.

Figure 12:
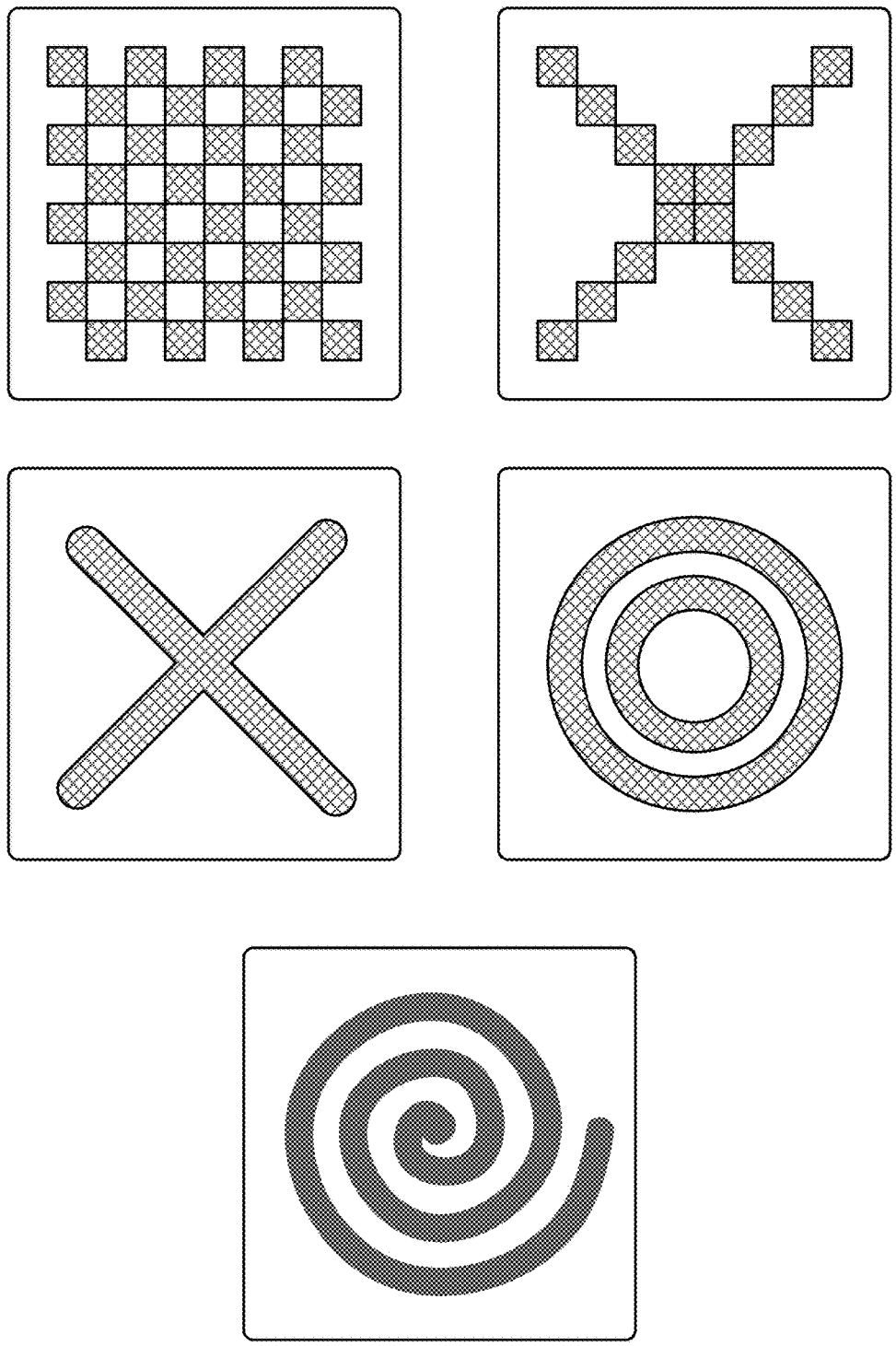
FIG. 12 shows four examples of wafer pocket design, according to embodiments of the present invention.

Note that a variety of patterns can be used to configure the bottom of a wafer pocket. FIG. 12 shows four examples of wafer pocket design, according to embodiments of the present invention. In these examples, the cross hatch patterned or gray areas are the flat top surfaces of the wafer pocket bottom, which support the wafer. In general, the bottom of a wafer pocket can have a number of recesses or protrusions with different patterns. A particular design may depend on the desired wafer contact area, structural rigidity, and weight.

Figure 13A:
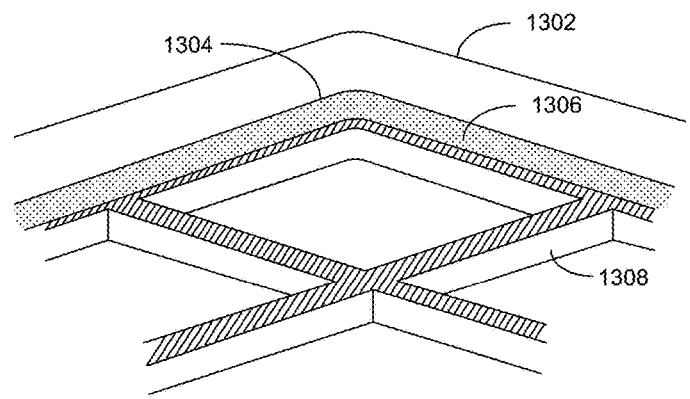
FIG. 13A shows a corner of such an exemplary wafer carrier, according to an embodiment of the present invention.

It is possible to reduce the total surface area of the wafer carrier by using a partially carved-out structure as a wafer pocket. FIG. 13A shows a corner of such an exemplary wafer carrier, according to an embodiment of the present invention. In this example, wafer carrier 1302 includes a wafer pocket 1304, which has a grid wafer-support structure 1308. Note that grid wafer-structure 1308 does not have a bottom. Compared with the grid structure illustrated in FIG. 11, which has a continuous bottom, grid wafer-support structure 1308 reduces the material on the bottom of wafer pocket 1304, which reduces the total surface area of wafer carrier 1302, resulting in less potential particle contamination to the wafer. Furthermore, this carved-out structure can reduce the weight of wafer carrier 1302 without significant compromise on the rigidity of wafer carrier 1302. Note that in this example wafer pocket 1304 also has a sloped ramp 1306 along its rim, the presence of which facilitates more precise placement of the wafer in wafer pocket 1304.

Figure 13B:
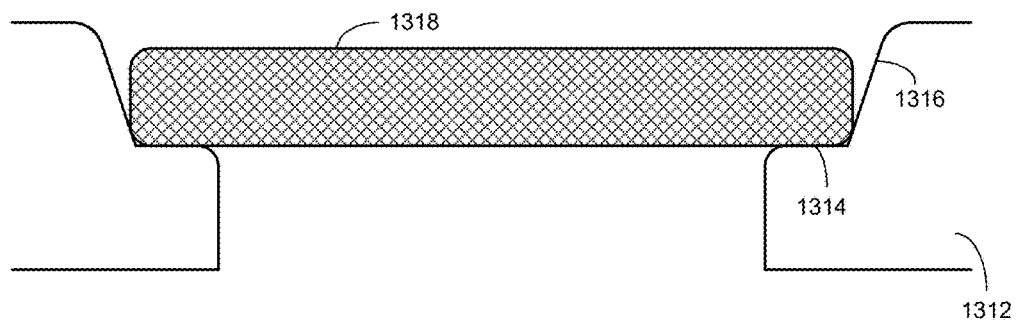
FIG. 13B shows the cross section of such an exemplary wafer pocket, according to one embodiment of the present invention.

In some embodiments, a wafer pocket can have most of its bottom part carved out, wherein the wafer is supported by the inner rim of the pocket. FIG. 13B shows the cross section of such an exemplary wafer pocket, according to one embodiment of the present invention. In this example, wafer pocket 1312 includes supporting rim 1314 and sloped ramp 1316. Wafer pocket does not have bottom, and the wafer is supported by supporting rim 1314, which provides a support platform along the inner rim of wafer pocket 1312. When wafer 1318 is loaded into wafer pocket 1312, wafer 1318 is guided by sloped ramp 1316, and rests upon supporting rim 1314.

In the example described above, each wafer carrier is coated with pyrolytic carbon, SiC, or a ceramic material. The coating covers every part of the wafer carrier, including the inner side walls of each wafer pocket and the wafer-supporting structure within a wafer pocket.

With the technological advances in wafer manufacturing it is expected that wafer sizes will continue to grow. As a result, it is expected that the dimension of wafer carriers would continue to grow. However, a wafer carrier made of carbon-based material cannot grow infinitely due to limitations in the graphite or CFC production process. To overcome this limitation, a wafer pocket can be made into an individual module, which is effectively an individual wafer carrier that can carry one wafer. Multiple such modules can be mechanically coupled together to form a larger wafer carrier.

Figure 14:
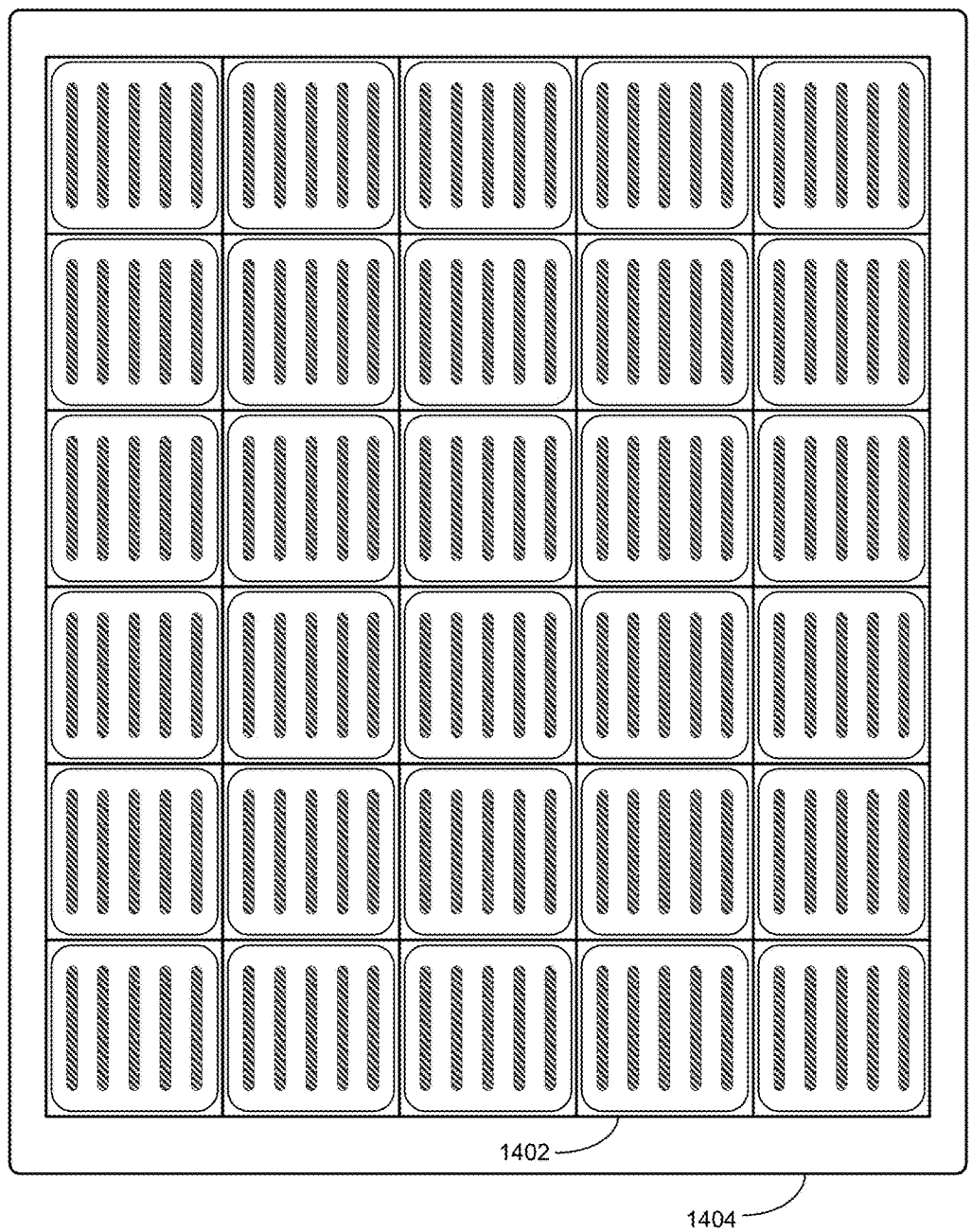
FIG. 14 shows a top view of a wafer carrier formed by multiple modules, according to one embodiment of the present invention.

FIG. 14 shows a top view of a wafer carrier formed by multiple modules, according to one embodiment of the present invention. In this example, a number of modules, such as module 1402, are mechanically coupled together to form a large wafer carrier. Each module includes one wafer pocket, which has a ridged bottom as illustrated in FIG. 7. A respective module has an interlocking mechanism on each of its four edges, which allows the module to be mechanically interlocked with a neighboring module. In some embodiments, the entire wafer carrier can be optionally placed on frame 1404 made of a rigid material (such as stainless steel, titanium, or non-metallic material). The use of frame 1404 can overcome the lack of rigidity caused by the mechanical coupling between the modules. Note that the use of smaller wafer pocket modules can also save the cost of manufacturing a large, monocoque wafer carrier, because the unit cost of a single-wafer module is often cheaper than the per-pocket cost of a large, monocoque carrier. Furthermore, instead of a single wafer pocket, a wafer pocket module may include a plurality of wafer pocket.

Figure 15:
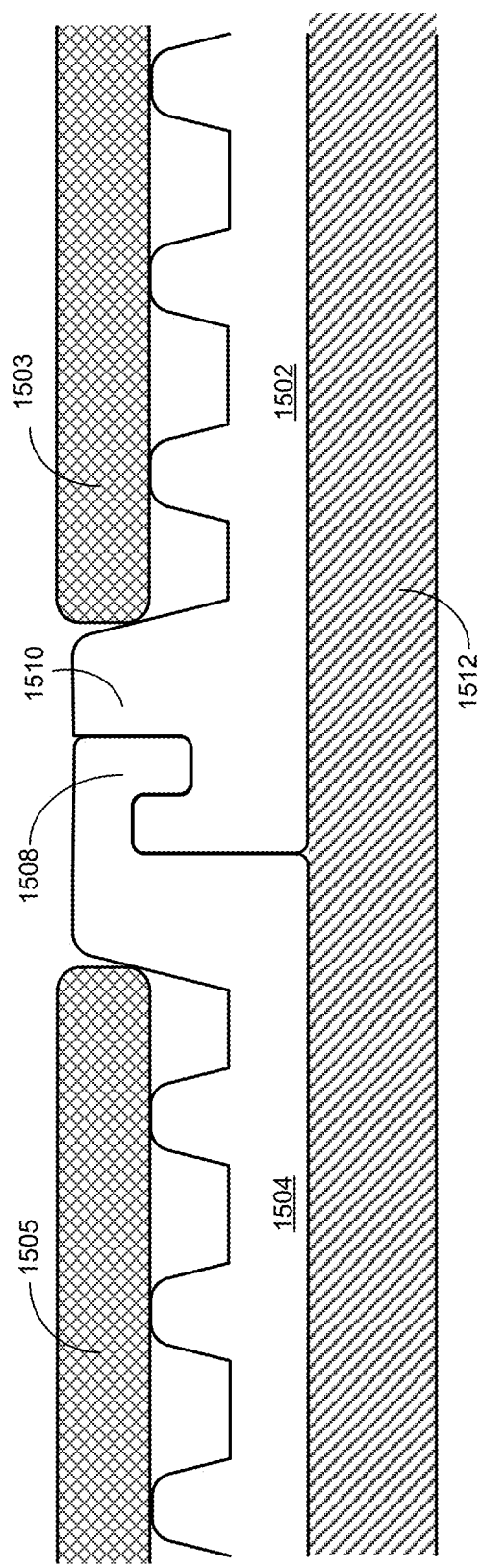
FIG. 15 shows a cross-sectional view of two interlocked wafer pocket modules, according to one embodiment of the present invention.

FIG. 15 shows a cross-sectional view of two interlocked wafer pocket modules, according to one embodiment of the present invention. In this example, modules 1502 and 1504 each have a ridged bottom to support wafers 1503 and 1505, respectively. Module 1502 has edge locking mechanism 1510, and module 1504 has edge locking mechanism 1508. To form a large wafer carrier, edge locking mechanisms 1510 and 1508 are mechanically coupled together. Furthermore, the entire wafer carrier system, which is formed by these interlocking modules, is placed on stainless steel frame 1512. Stainless steel frame 1512 provides the physical support for the entire wafer carrier, and prevents the interlocking mechanisms from being subject to excessive amount of mechanical stress when the wafer carrier is moved.

Figure 16:
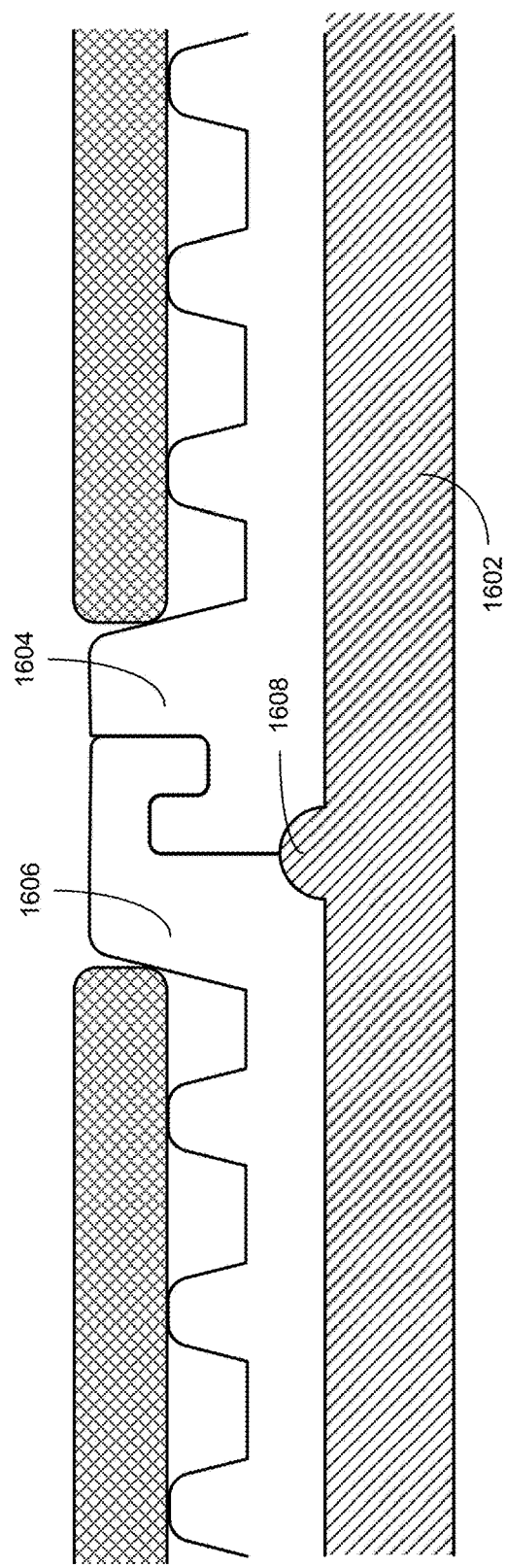
FIG. 16 shows a cross-sectional view of two interlocked wafer pocket modules retained in place by a protrusion on a metal frame, according to one embodiment of the present invention.

In some embodiments, the rigid frame that supports the entire wafer carrier can have protrusions on its bottom to facilitate placing and retaining the wafer pocket modules. FIG. 16 shows a cross-sectional view of two interlocked wafer pocket modules retained in place by a protrusion on a metal frame, according to one embodiment of the present invention. In this example, interlocked wafer pocket modules 1604 and 1606 are placed on stainless steel frame 1602. Both modules 1604 and 1606 have a recess at the location where these two modules are coupled together. Ideally, this recess matches protrusion 1608 on frame 1602. The presence of protrusion 1608 prevents wafer pocket modules 1604 and 1606 from being displaced.

Figure 17:
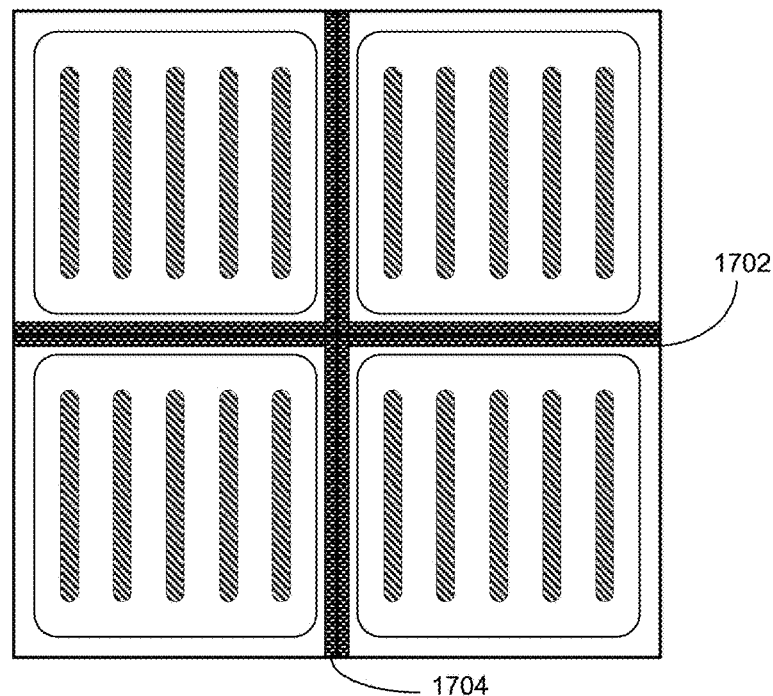
FIG. 17 shows a top view of four interlocked wafer pocket modules retained by elongated protrusion ridges on a supporting rigid frame, according to one embodiment of the present invention.
Figure 18:
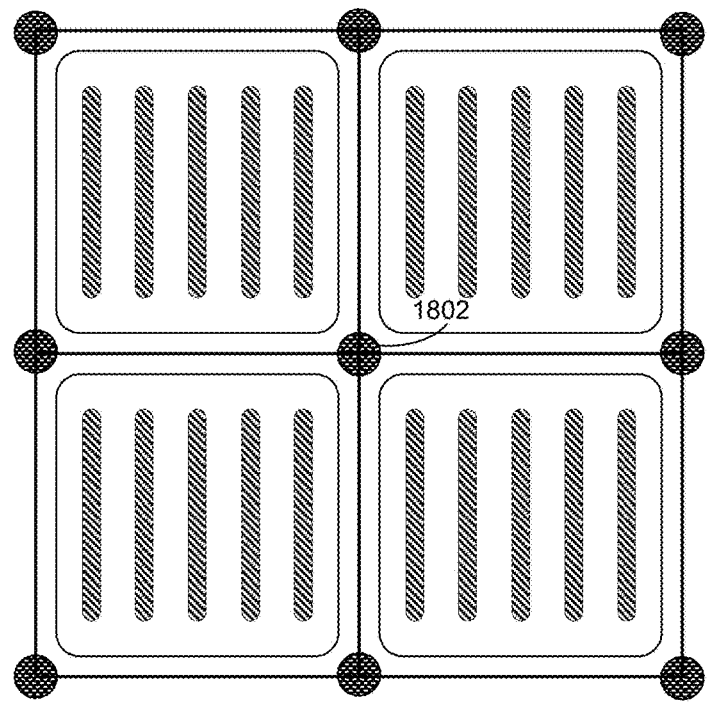
FIG. 18 shows a top view of four interlocked wafer pocket modules retained by spherical protrusions on a supporting rigid frame, according to one embodiment of the present invention.

Note that protrusion 1608 can be an elongated ridge along the joining seam of two interlocked modules, or can be a partial sphere at the joining point of four interlocked modules. FIG. 17 shows a top view of four interlocked wafer pocket modules retained by elongated protrusion ridges on a supporting rigid frame, according to one embodiment of the present invention. In this example, longitudinal protrusion ridge 1704 placed between columns of interlocked modules prevents the modules from being displaced in the left-right direction. Latitudinal protrusion ridge 1702 placed between rows of interlocked modules prevents the modules from being displaced in the up-down direction. FIG. 18 shows a top view of four interlocked wafer pocket modules retained by spherical protrusions on a supporting rigid frame, according to one embodiment of the present invention. In this example, spherical protrusion 1802 is placed at the location where four interlocked wafer pocket modules join. Such a protrusion is present at each of such joining locations. These protrusions can jointly prevent the interlocked modules from moving in any direction. Note that in one embodiment the recess at each corner of a wafer pocket module can be a portion of a sphere (e.g., a quarter of a semi-sphere), such that when four modules are interlocked together their respective recesses jointly form a half sphere, which can match the half-sphere protrusion on the underlying rigid frame.

Figure 19:
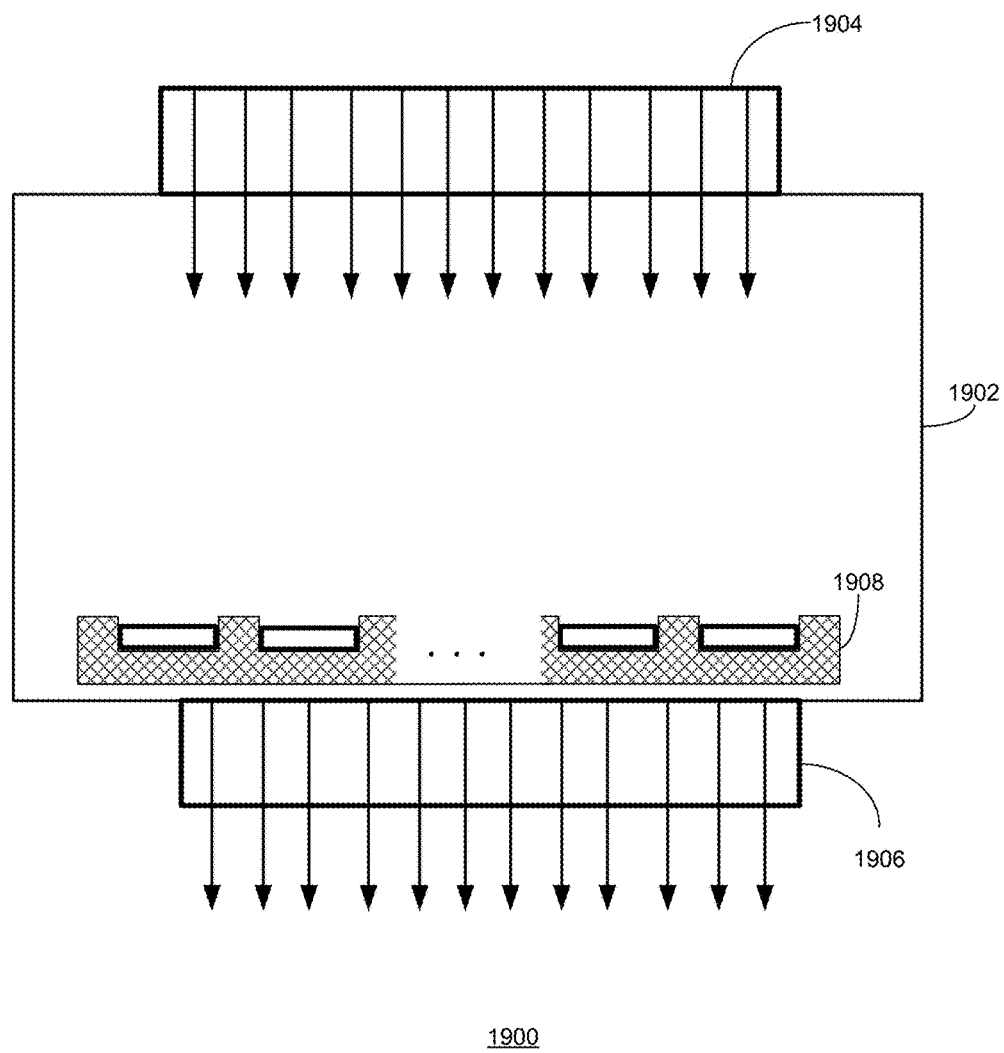
FIG. 19 presents a diagram illustrating an exemplary chemical vapor deposition (CVD) tool used for solar cell fabrication, according to an embodiment of the present invention.

FIG. 19 presents a diagram illustrating an exemplary chemical vapor deposition (CVD) tool used for solar cell fabrication, according to an embodiment of the present invention. In FIG. 19, CVD tool 1900 includes chamber 1902, top gas delivery system 1904, optional bottom gas exhaust system 1906, and wafer carrier 1908.

Chamber 1902 holds the reaction gases. The top gas delivery system 1904 and bottom gas exhaust system 1906 can deliver reaction gases into chamber 1902 and output exhaust gases from chamber 1902. The arrows show the direction of the gas flow. To ensure a uniform deposition across the wafer surface, sub-gas lines with individual flow control can be used for gas delivery. Detailed descriptions of a uniform gas delivery system can be found in U.S. patent application Ser. No. 12/952,127, entitled "Multi-Channel Gas-Delivery System," by inventors Yan Rozenzon, Robert T. Trujillo, and Steven C. Beese, filed Nov. 22, 2010, the disclosure of which is incorporated herein by reference in its entirety.

Wafer carrier 1908 is positioned inside chamber 1902. In some embodiments, wafer carrier 1908 is oriented horizontally in such a way that the to-be-deposited wafer surface is facing the incoming gas flow. In some embodiments, wafer carrier 1908 is made of graphite or CFC with its surface coated with a layer of pyrolytic carbon or SiC. In further embodiments, the thickness of the coating is between 10 and 50 micrometers. As shown in FIG. 19, wafer carrier 1908 includes a number of pockets for holding wafers. To minimize contact between wafer carrier 1908 and the wafers, in some embodiments, the bottom of the pockets can be a non-flat surface or a partially carved-out structure. Furthermore, wafer carrier 1908 can be configured based on any of the embodiments described above.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An apparatus for carrying one or more wafers, the apparatus comprising:
   a carrier coated with a pyrolytic carbon layer:
      wherein the carrier comprises a number of pockets configured to accommodate the wafers, wherein a respective pocket has a ridged bottom comprising a number of ridges, wherein a top edge of a respective ridge is rounded, and wherein a radius of the rounded top edge is at least 0.1 mm;
      wherein the pyrolytic carbon layer has a porosity between 0 and 0.1%;
      wherein at least one edge of the carrier comprises an L-shaped interlocking mechanism that has a horizontal portion and a vertical portion; and
      wherein the L-shaped interlocking mechanism is configured to interlock with a corresponding L-shaped interlocking mechanism of an adjacent carrier, thereby facilitating an interlocked joint between the carrier and the adjacent carrier to prevent relative lateral shifts between the carrier and the adjacent carrier.

2. The apparatus of claim 1, wherein the carrier comprises graphite or carbon fiber composite.

3. The apparatus of claim 1, wherein the pyrolytic carbon layer has a thickness between 10 and 50 micrometers.

4. The apparatus of claim 1, wherein the carrier is adapted to accommodate the wafers of a size and shape of:
   a 5-inch by 5-inch square;
   a 6-inch by 6-inch square;
   a 5-inch by 5-inch pseudo-square; or
   a 6-inch by 6-inch pseudo-square.

5. The apparatus of claim 1,
wherein edges around and within the respective pocket are rounded.

6. The apparatus of claim 1,
wherein the respective pocket comprises a sloped ramp along the pocket's rim, thereby facilitating wafer loading.

7. A semiconductor deposition tool, comprising:
a deposition chamber; and
a carrier coated with a pyrolytic carbon layer:
wherein the carrier comprises a number of pockets configured to accommodate the wafers, wherein a respective pocket has a ridged bottom comprising a number of ridges, wherein a top edge of a respective ridge is rounded, and wherein a radius of the rounded top edge is at least 0.1 mm;
wherein the pyrolytic carbon layer has a porosity between 0 and 0.1%;
wherein at least one edge of the carrier comprises an L-shaped interlocking mechanism that has a horizontal portion and a vertical portion; and
wherein the L-shaped interlocking mechanism is configured to interlock with a corresponding L-shaped interlocking mechanism of an adjacent carrier, thereby facilitating an interlocked joint between the carrier and the adjacent carrier to prevent relative lateral shifts between the carrier and the adjacent carrier.

8. The deposition tool of claim 7, wherein the carrier comprises graphite or carbon fiber composite.

9. The deposition tool of claim 7, wherein the pyrolytic carbon layer has a thickness between 10 and 50 micrometers.

10. The deposition tool of claim 7, wherein is the carrier is adapted to accommodate the wafers of a size and shape of:
a 5-inch by 5-inch square;
a 6-inch by 6-inch square;
a 5-inch by 5-inch pseudo-square; or
a 6-inch by 6-inch pseudo-square.

11. The deposition tool of claim 7,
wherein edges around and within the respective pocket are rounded.

12. The deposition tool of claim 7,
wherein the respective pocket comprises a sloped ramp along the pocket's rim, thereby facilitating wafer loading.

\* \* \* \* \*